(12) United States Patent
Jung et al.

(10) Patent No.: US 8,183,583 B2
(45) Date of Patent: May 22, 2012

(54) LED PACKAGE MODULE

(75) Inventors: Suk Ho Jung, Gyunggi-do (KR); Hyung Kun Kim, Gyunggi-do (KR); Hak Hwan Kim, Gyunggi-do (KR); Young Jin Lee, Seoul (KR); Ho Sun Paek, Gyunggi-do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 113 days.

(21) Appl. No.: 12/571,754

(22) Filed: Oct. 1, 2009

(65) Prior Publication Data

US 2010/0090231 A1    Apr. 15, 2010

(30) Foreign Application Priority Data

Oct. 15, 2008  (KR) .................. 10-2008-0101265

(51) Int. Cl.
*H01L 33/00* (2010.01)
(52) U.S. Cl. ............. 257/89; 257/88; 257/E33.061
(58) Field of Classification Search ........... 257/E33.001, 257/79–103, E33.061
See application file for complete search history.

(56) References Cited

U.S. PATENT DOCUMENTS

| 6,822,269 | B2 | 11/2004 | Horiuchi et al. |
| 7,183,632 | B2 | 2/2007 | Arndt |
| 2004/0075100 | A1 | 4/2004 | Bogner et al. |
| 2005/0139846 | A1 | 6/2005 | Park et al. |
| 2010/0025700 | A1* | 2/2010 | Jung et al. ............ 257/89 |

* cited by examiner

*Primary Examiner* — Tucker Wright
(74) *Attorney, Agent, or Firm* — McDermott Will & Emery LLP

(57) ABSTRACT

An LED package module according to an aspect of the invention may include: a substrate having predetermined electrodes thereon; a plurality of LED chips mounted onto the substrate, separated from each other at predetermined intervals, and electrically connected to the electrodes; a first color resin portion molded around at least one of the plurality of LED chips; a second color resin portion molded around all of the LED chips except for the LED chip around which the first color resin portion is molded, and having a different color from the first color resin portion; and a third color resin portion encompassing both the first color resin portion and the second color resin portion and having a different color from the first color resin portion and the second color resin portion. Accordingly, a reduction in luminous efficiency of an LED caused by yellowing is prevented to thereby increase luminous efficiency and achieve a reduction in size.

9 Claims, 2 Drawing Sheets

LED PACKAGE MODULE

CROSS-REFERENCE TO RELATED APPLICATIONS

This application claims the priority of Korean Patent Application No. 10-2008-0101265 filed on Oct. 15, 2008, in the Korean Intellectual Property Office, the disclosure of which is incorporated herein by reference.

BACKGROUND OF THE INVENTION

1. Field of the Invention

The present invention relates to LED package modules, and more particularly, to an LED package module for lighting that is used in lighting components or devices.

2. Description of the Related Art

In general, light emitting diode (LED) package modules for lighting have silicon lenses and packages mounted with LED chips, phosphors and resin. LED package optical systems maintain stable optical output in an optimum state, protect light source devices, and ensure the reliability of light source devices for long-term use in any environment.

Recently, applications and requirements for lighting for various purposes, including landscape lighting and other functional lighting, have greatly increased. The demand for high-power output has also increased accordingly. In order to meet various applications, the reduction in size, thickness, and weight has been demanded for the practicality and convenience of design. Therefore, heat-dissipating designs and mechanical designs of LED packages have been important issues.

Research and development of mechanical packages and ceramic packages has been conducted for heat dissipation. In terms of mechanical design, chip-on-board (COB) technology has been used. Compared to existing plastic molding and lead-frame packaging technologies, the above-described technologies are very effective in the areas of mechanical design and heat-dissipating design.

However, lighting package modules using ultra violet (UV) LEDs may significantly reduce luminous efficiency due to the yellowing of plastics exposed to ultraviolet rays for extended periods.

SUMMARY OF THE INVENTION

An aspect of the present invention provides an LED package module that prevents a reduction in luminous efficiency of an LED caused by yellowing to thereby increase luminous efficiency and achieve a reduction in size.

According to an aspect of the present invention, there is provided an LED package module including: a substrate having predetermined electrodes thereon; a plurality of LED chips mounted onto the substrate, separated from each other at predetermined intervals, and electrically connected to the electrodes; a first color resin portion molded around at least one of the plurality of LED chips; a second color resin portion molded around all of the LED chips except for the LED chip around which the first color resin portion is molded, and having a different color from the first color resin portion; and a third color resin portion encompassing both the first color resin portion and the second color resin portion and having a different color from first color resin portion and the second color resin portion.

The first color resin portion may be a red resin portion including a red phosphor, the second color resin portion may be a green resin portion including a green phosphor, and the third color resin portion may be a blue resin portion including a blue phosphor.

Each of the red resin portion and the green resin portion may be molded around one LED chip on the substrate and be substantially in the form of a dome, and the blue resin portion may be molded around both the red resin portion and the green resin portion and be substantially in the form of a dome.

The LED package module may further include a body including a first layer provided on the substrate and receiving the plurality of separated LED chips, the red resin portion, and the green resin portion, and a second layer provided on the first layer and receiving the blue resin portion encompassing the red resin portion and the green resin portion.

The body may include: a plurality of cavities provided in the first layer, receiving the plurality of LED chips, and filled with the red resin portion and the green resin portion; and an opening provided in the second layer and filled with the blue resin portion to encompass both the red resin portion and the green resin portion.

A plurality of cavities may be provided on the substrate, receive the plurality of LED chips, and be filled with the red resin portion and the green resin portion, and an opening may be formed above the cavities and filled with the blue resin portion to encompass the red resin portion and the green resin portion.

The plurality of LED chips may be inclined at predetermined angles so that central lines of optical paths of the plurality of LED chips cross each other.

A bottom surface of each of the plurality of cavities to be mounted with the separated LED chips may be inclined at a predetermined angle to form an inclined surface so that central lines of optical paths of the plurality of LED chips cross each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
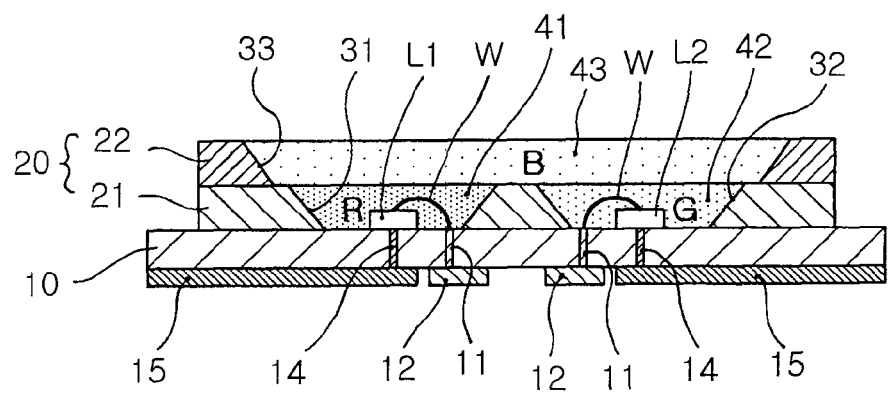
FIG. 1 is a view schematically illustrating a lateral cross section of an LED package module according to an exemplary embodiment of the present invention.
Figure 2:
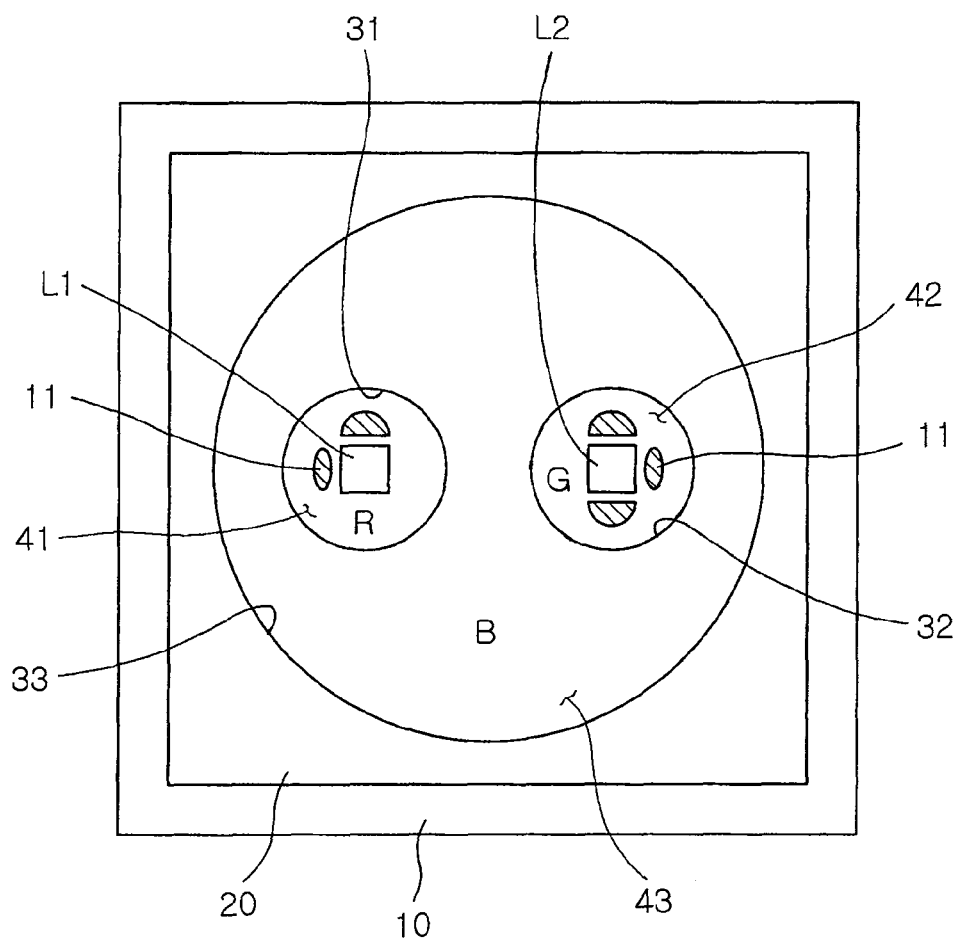
FIG. 2 is a plan view schematically illustrating the LED package module, illustrated in FIG. 1.

First, with reference to FIGS. 1 and 2, an LED package module according to an exemplary embodiment of the invention will be described. FIG. 1 is a view schematically illustrating a lateral cross-section of an LED package module according to an exemplary embodiment of the invention. FIG. 2 is a plan view schematically illustrating the LED package module, shown in FIG. 1.

As shown in FIGS. 1 and 2, an LED package module according to an exemplary embodiment of the invention includes a substrate 10, a body 20, and a plurality of LED chips L1 and L2. The LED chips L1 and L2 are positioned in the body 20 and mounted onto the substrate 10 by bonding.

The substrate 10 is a ceramic substrate on which electrode patterns 12 are formed to provide an electrical connection with other components. Via electrodes 11 are formed in the substrate 10 to electrically connect the substrate 10 and the LED chips L1 and L2 mounted above the electrode patterns 12.

Heat sinks 15 are provided to dissipate heat from the LED chips L1 and L2. Vias 14 are formed through the substrate 10 such that the heat sinks 15 and the LED chips L1 and L2 are thermally connected to each other.

The body 20 has two layers. That is, a first layer 21 forms the lower side of the body 20, and a second layer 22 forms the upper side thereof. The first layer 21 and the second layer 22 may be separately manufactured and then connected to each other. Alternatively, the first layer 21 and the second layer 22 may be formed integrally with each other.

The first layer 21 includes a plurality of cavities 31 and 32 in which the plurality of LED chips L1 and L2 are respectively received.

Each of the cavities 31 and 32 has a reflective surface inclined at a predetermined angle and a bottom surface through which the via 14 and the via electrode 11 are exposed.

The via 14 is thermally connected to the LED chip L1 or L2, and the via electrode 11 is connected to the LED chip L1 or L2 by bonding using wires w or flip chip bonding.

The cavities 31 and 32 are filled with a red resin portion 41 including a red phosphor and a green resin portion 42 including a green phosphor, respectively.

Preferably, the heights of the red resin portion 41 and the green resin portion 42 filling the cavities 31 and 32, respectively, do not exceed the height of the interface between the first layer 21 and the second layer 22.

An opening 33 is formed in the second layer 22. As shown in FIGS. 1 and 2, the opening 33 is preferably large enough to encompass both the cavities 31 and 32 that are formed in the first layer 21.

Then, the opening 33 is filled with a blue resin portion 43 including a blue phosphor.

That is, the blue resin portion 43 fills the opening 33 to thereby encompass the red resin portion 41 and the green resin portion 42 that fill the cavities 31 and 32, respectively.

That is, the red resin portion 41 and the green resin portion 42 are disposed adjacently on the first layer 21. The blue resin portion 43 is placed in the opening 33 of the second layer 22 formed on the first layer 21.

Light generated from the LED chip L1 around which the red resin portion 41 is molded supplies energy to the red phosphor included in the red resin portion 41, thereby generating red light. Light generated from the LED chip L2 around which the green resin portion 42 is molded supplies energy to the green phosphor included in the green resin portion 42, thereby generating green light.

Here, the red light and the green light move toward the blue resin portion 43. In the blue resin portion 43, the red light and the green light are mixed together and affected by the blue phosphor included in the blue resin portion 43 to thereby generate white light, which is then emitted to the outside.

As the red resin portion 41 and the green resin portion 42 are disposed in the first layer 21, and the blue resin portion 43 is disposed in the second layer 22 formed on the first layer 21, light ultimately passes through the blue resin portion 43 to thereby generate white light with high luminance.

In this embodiment, illustrated in FIGS. 1 and 2, the red resin portion 41 and the green resin portion 42 are disposed in the first layer 21, and the blue resin portion 43 is disposed in the second layer 22 formed on the first layer 21. However, the invention is not limited thereto, and the arrangement of the red, green, and blue resin portions can be changed.

However, when the color arrangement is changed, white light is not necessarily emitted.

Figure 3:
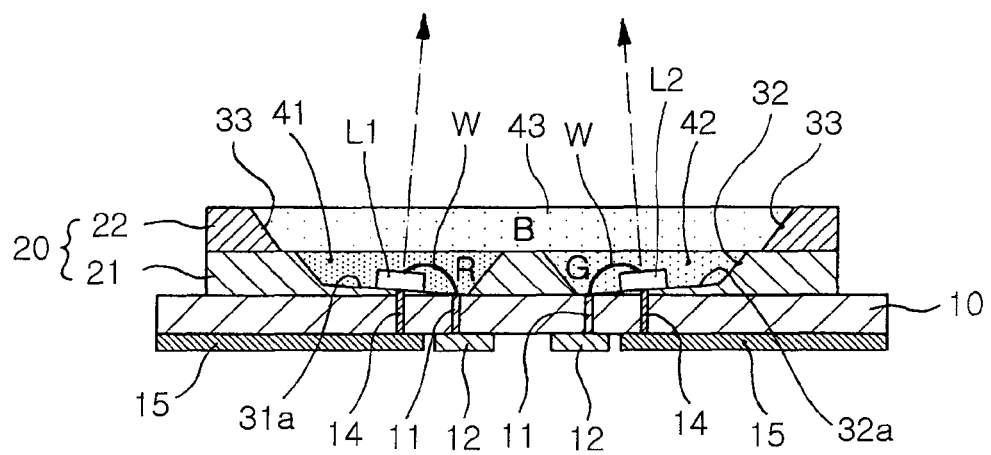
FIG. 3 is a view schematically illustrating an LED package module according to another exemplary embodiment of the present invention.

Referring to FIG. 3, an LED package module according to another exemplary embodiment of the invention will be described.

Like the body of the LED package module according to the embodiment, illustrated in FIGS. 1 and 2, the body 20 of an LED package module according to the embodiment, illustrated in FIG. 3, includes a first layer 21 and a second layer 22. The first layer 21 includes a plurality of cavities 31 and 32. The second layer 22 has an opening 33 that is large enough to encompass both the cavities 31 and 32.

Here, in the same manner as the first and second layers of the LED package module according to the embodiment, shown in FIG. 1, the first layer 21 and the second layer 22 may be separately manufactured and then are connected to each other, or be formed integrally with each other.

The cavities 31 and 32, formed in the first layer 21 of the body 20 of the LED package module according to the embodiment, shown in FIG. 3, include inclined surfaces 31a and 32a, respectively. That is, the bottom surface of each of the cavities 31 and 32 is inclined at a predetermined angle.

That is, in the embodiment, illustrated in FIG. 3, the bottom surfaces of the cavities 31 and 32 form the inclined surfaces 31a and 32a, respectively, such that the central line of the optical path of a first LED chip L1 and the central line of the optical path of a second LED chip L2 cross each other.

As shown in FIG. 3, the cavities 31 and 32 have the inclined surfaces 31a and 32a at the bottom surfaces thereof, respectively, so that the LED chips L1 and L2 are inclined in a direction in which the LED chips L1 and L2 face each other. As a result, red light and green light can be effectively mixed together to thereby generate high quality white light.

In FIG. 3, the two LED chips in the cavities are mounted so that they are inclined at predetermined angles in a direction in which they face each other. However, the invention is not limited thereto. When more than two LED chips are mounted, the LED chips are inclined at predetermined angles in a direction in which all of the LED chips face each other, so that color separation can be prevented and color mixing can be more efficiently performed.

Since the LED package module according to this embodiment is substantially the same as the LED package module according to the embodiment, illustrated in FIGS. 1 and 2, except for the inclined surfaces formed on the cavities, a detailed description thereof will be omitted.

An LED package module according to another exemplary embodiment of the invention will now be described with reference to FIG. 4.

Figure 4:
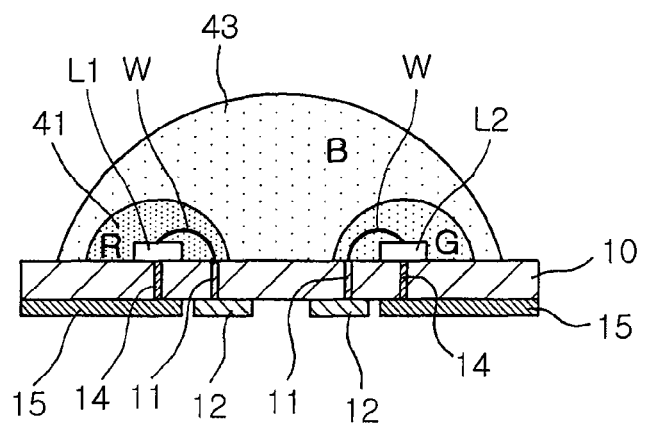
FIG. 4 is a view schematically illustrating a lateral cross-section of an LED package module according to another exemplary embodiment of the present invention.

Basically, the LED package module according to the embodiment, illustrated in FIG. 4, does not have a body.

That is, a plurality of LED chips L1 and L2 are separated from each other at a predetermined interval and mounted onto a substrate 10. Resins having different colors are applied to the LED chips L1 and L2.

In the LED package module according to the embodiment of the invention, illustrated in FIG. 4, the LED chip L1 is mounted onto the first substrate 10, and a red resin portion 41 is in the form of a dome and molded around the first LED chip L1.

When the second LED chip L2 is separated from the first LED chip L1, a green resin portion 42 is in the form of a dome and molded around the second LED chip L2.

Further, a blue resin portion 43 is in the form of a dome and molded around the red resin portion 41 and the green resin portion 42.

That is, the red resin portion 41 and the green resin portion 42 are disposed adjacently on the substrate 10, and the blue resin portion 43 encompasses the red resin portion 41 and the green resin portion 42.

Light generated from the LED chip L1 around which the red resin portion 41 is molded supplies energy to a red phosphor included in the red resin portion 41, thereby generating red light. Light generated from the LED chip L2 around which the green resin portion 42 is molded supplies energy to a green phosphor included in the green resin portion 42, generating green light.

Here, red light and green light move toward the blue resin portion 43. In the blue resin portion 43, the red light and the green light are mixed together and affected by the blue phosphor included in the blue resin portion 43 to generate white light, which is then emitted to the outside.

Here, like the embodiment, illustrated in FIG. 1, the arrangement of the red resin portion, the green resin portion, and the blue resin portion may be changed. Here, white light is not necessarily emitted from the LED package module.

Since the LED package module according to this embodiment, illustrated in FIG. 4, is substantially the same as the LED package module according to the embodiment, illustrated in FIG. 1, that is, the substrate 10 and the via electrodes formed thereon, except for the above-described features, a detailed description thereof will be omitted.

As set forth above, according to exemplary embodiments of the invention, the LED package module prevents a reduction in luminous efficiency of an LED caused by yellowing, thereby increasing luminous efficiency and achieving a reduction in size.

While the present invention has been shown and described in connection with the exemplary embodiments, it will be apparent to those skilled in the art that modifications and variations can be made without departing from the spirit and scope of the invention as defined by the appended claims.

What is claimed is:

1. An LED package module comprising:
   a substrate having predetermined electrodes thereon;
   a plurality of LED chips mounted onto the substrate, separated from each other at predetermined intervals, and electrically connected to the electrodes;
   a first color resin portion molded around at least one of the plurality of LED chips;
   a second color resin portion molded around all of the LED chips except for the LED chip around which the first color resin portion is molded, and having a different color from the first color resin portion; and
   a third color resin portion encompassing both the first color resin portion and the second color resin portion and having a different color from the first color resin portion and the second color resin portion.

2. The LED package module of claim 1, wherein the first color resin portion is a red resin portion including a red phosphor, the second color resin portion is a green resin portion including a green phosphor, and the third color resin portion is a blue resin portion including a blue phosphor.

3. The LED package module of claim 2, wherein each of the red resin portion and the green resin portion is molded around one LED chip on the substrate and is substantially in the form of a dome, and the blue resin portion is molded around both the red resin portion and the green resin portion and is substantially in the form of a dome.

4. The LED package module of claim 2, further comprising a body including a first layer provided on the substrate and receiving the plurality of LED chips, the red resin portion, and the green resin portion, and a second layer provided on the first layer and receiving the blue resin portion encompassing the red resin portion and the green resin portion.

5. The LED package module of claim 4, wherein the body comprises:
   a plurality of cavities provided in the first layer, receiving the plurality of separated LED chips, and filled with the red resin portion and the green resin portion; and
   an opening provided in the second layer and filled with the blue resin portion to encompass both the red resin portion and the green resin portion.

6. The LED package module of claim 2, wherein a plurality of cavities are provided on the substrate, separately receive the plurality of LED chips, and are separately filled with the red resin portion and the green resin portion, and an opening is formed above the cavities and filled with the blue resin portion to encompass the red resin portion and the green resin portion.

7. The LED package module of claim 3, wherein the plurality of LED chips are inclined at predetermined angles so that central lines of optical paths of the plurality of LED chips cross each other.

8. The LED package module of claim 5, wherein a bottom surface of each of the plurality of cavities to be mounted with the separated LED chips is inclined at a predetermined angle to form an inclined surface so that central lines of optical paths of the plurality of LED chips cross each other.

9. The LED package module of claim 6, wherein a bottom surface of each of the plurality of cavities to be mounted with the separated LED chips is inclined at a predetermined angle to form an inclined surface so that central lines of optical paths of the plurality of LED chips cross each other.

* * * * *